United States Patent
Yuan et al.

(10) Patent No.: US 9,680,418 B2
(45) Date of Patent: Jun. 13, 2017

(54) VARIABLE GAIN AMPLIFIER WITH IMPROVED POWER SUPPLY NOISE REJECTION

(71) Applicant: QUALCOMM Incorporated, San Diego, CA (US)

(72) Inventors: Xiaobin Yuan, Cary, NC (US); Joseph Natonio, Wappingers Falls, NY (US); Kevin Robert Bartholomew, Wake Forest, NC (US); Mangal Prasad, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/941,366

(22) Filed: Nov. 13, 2015

(65) Prior Publication Data

US 2017/0141735 A1   May 18, 2017

(51) Int. Cl.
*H03F 3/45* (2006.01)
*H03F 1/02* (2006.01)
*H03G 3/20* (2006.01)

(52) U.S. Cl.
CPC ....... *H03F 1/0211* (2013.01); *H03F 3/45179* (2013.01); *H03G 3/20* (2013.01); *H03F 2203/45154* (2013.01)

(58) Field of Classification Search
CPC ....... H03F 3/45; H03G 3/3036; H03G 3/3042
USPC .................................. 330/253, 254
See application file for complete search history.

(56) References Cited

U.S. PATENT DOCUMENTS

| | | |
|---|---|---|
| 5,856,891 A | 1/1999 | Ngo |
| 6,545,534 B1 | 4/2003 | Mehr |
| 6,771,124 B1 | 8/2004 | Ezell |
| 7,091,783 B2 | 8/2006 | Bailey et al. |
| 7,761,071 B2 | 7/2010 | Miyasita et al. |
| 8,081,031 B2 | 12/2011 | Bi |
| 8,330,537 B1 | 12/2012 | Ghorpade et al. |
| 8,665,028 B2 | 3/2014 | Kim et al. |
| 9,035,700 B2 | 5/2015 | Kitamura |
| 9,106,193 B2 | 8/2015 | Fujii |
| 2006/0066399 A1 | 3/2006 | Stoger et al. |

(Continued)

OTHER PUBLICATIONS

Partial International Search Report and Written Opinion—PCT/US2016/056905—ISA/EPO—Feb. 6, 2017.

*Primary Examiner* — Steven J Mottola
(74) *Attorney, Agent, or Firm* — Chui-kiu Teresa Wong; Kenneth Vu

(57) ABSTRACT

A voltage gain amplifier (VGA) configured to have reduced supply noise. The VGA includes first resistor, first FET, and a first current-source coupled between first and second voltage rails. The VGA includes second resistor, second FET, and second current-source coupled between the voltage rails. A variable resistor is coupled between the respective sources of the first and second FETs. Variable capacitors are coupled between the first or a third voltage rail and the sources of the first and second input FETs, respectively. If capacitors are coupled to the first voltage rail, noise cancellation occurs across the gate-to-source voltages of the FETs if an input differential signal applied to the gates of the FETs is derived from a supply voltage at the first voltage rail. If capacitors are coupled to the third rail, supply noise is reduced if the supply voltage at the third rail is generated by a cleaner regulator.

27 Claims, 6 Drawing Sheets

(56) References Cited

U.S. PATENT DOCUMENTS

| | | | |
|---|---|---|---|
| 2006/0244519 A1 | 11/2006 | Kocaman et al. | |
| 2009/0237165 A1* | 9/2009 | Chang | H03F 3/195 330/277 |
| 2010/0214493 A1* | 8/2010 | Jonsson | H03F 1/26 348/726 |

* cited by examiner

VARIABLE GAIN AMPLIFIER WITH IMPROVED POWER SUPPLY NOISE REJECTION

BACKGROUND

Field

Aspects of the present disclosure relate generally to variable gain amplifiers, and more particularly, to a variable gain amplifier with improved power supply noise rejection.

Background

A variable gain amplifier (VGA) may be configured to apply a gain-frequency response to an input differential signal to generate an output differential signal. The gain-frequency response is typically set or adjusted via a variable capacitor and a variable resistor coupled in parallel between sources of input differential field effect transistors (FETs) of the VGA. The input differential signal is applied to the gates of the input differential FETs, respectively. The output differential signal is generated at the drains of the input differential FETs, respectively.

In such VGA configuration, it is desirable to reduce noise emanating from a supply voltage rail from propagating into the signal path of the VGA. Additionally, it is desirable to reduce area on an integrated circuit (IC) to implement the variable capacitor of the VGA. Further, it is desirable to reduce wiring parasitic associated with connecting the variable capacitor to the sources of the input differential FETs to achieve a better control and desirable gain-frequency response for the VGA.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a first field effect transistor (FET) having a first gate, a first source, and a first drain, wherein the first gate is configured to receive a positive component of a first differential signal, and wherein the first source and the first drain are coupled between a first voltage rail and a second voltage rail; a second FET including a second gate, a second source, and a second drain, wherein the second gate is configured to receive a negative component of the first differential signal, and wherein the second source and the second drain are coupled between the first voltage rail and the second voltage rail; a first capacitor coupled between the first voltage rail or a third voltage rail and the first source of the first FET; and a second capacitor coupled between the first voltage rail or the third voltage rail and the second source of the second FET.

Another aspect of the disclosure relates to a method including applying a positive component of a first differential signal to a first gate of a first field effect transistor (FET), wherein the first FET includes a first source and a first drain coupled between a first voltage rail and a second voltage rail; applying a negative component of the first differential signal to a second gate of a second FET, wherein the second FET includes a second source and a second drain coupled between the first voltage rail and the second voltage rail; applying noise from the first voltage rail or a third voltage rail to the first source of the first FET via a first capacitor; and applying noise from the first voltage rail or the third voltage rail to the second source of the second FET via a second capacitor.

Another aspect of the disclosure relates to an apparatus including means for applying a positive component of a first differential signal to a first gate of a first field effect transistor (FET), wherein the first FET includes a first source and a first drain coupled between a first voltage rail and a second voltage rail; means for applying a negative component of the first differential signal to a second gate of a second FET, wherein the second FET includes a second source and a second drain coupled between the first voltage rail and the second voltage rail; means for applying noise from the first voltage rail or a third voltage rail to the first source of the first FET via a first capacitor; and means for applying noise from the first voltage rail or the third voltage rail to the second source of the second FET via a second capacitor.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
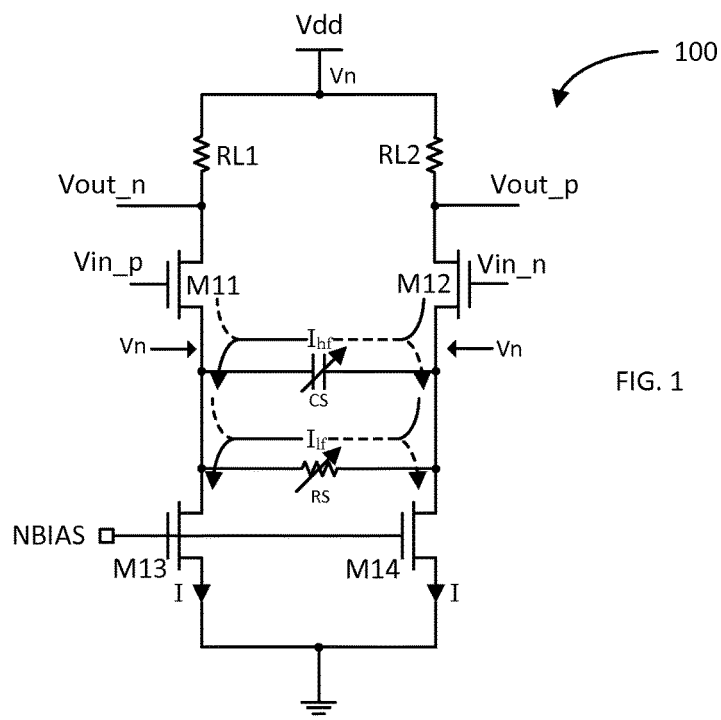
FIG. 1 illustrates a schematic diagram of an exemplary variable gain amplifier (VGA) in accordance with an aspect of the disclosure.

FIG. 1 illustrates a schematic diagram of an exemplary variable gain amplifier (VGA) 100 in accordance with an aspect of the disclosure. The VGA 100 may be employed at a receiver or proximate an input of an integrated circuit (IC). The VGA 100 may be used for providing a specified gain for relatively low frequencies of a received signal, and a higher gain profile (e.g., a peak) for relatively high frequencies of the received signal to compensate for high frequency losses of the received signal through a channel.

In particular, the VGA 100 includes a first load resistor RL1, a first input transistor M11, and a first current-source transistor M13 coupled in series between a first voltage rail (e.g., Vdd) and a second voltage rail (e.g., ground). The VGA 100 further includes a second load resistor RL2, a second input transistor M12, and a second current-source transistor M14 coupled in series between Vdd and ground. The transistors M11, M12, M13, and M14 may be configured as n-channel metal oxide semiconductor (NMOS) field effect transistors (FETs), and are referred to hereinafter as "NMOS." Additionally, the VGA 100 includes a variable capacitor CS and a variable resistor RS coupled in parallel between the sources of NMOS M11 and M12.

The gates of the first and second input NMOS M11 and M12 are configured to receive positive and negative components Vin_p and Vin_n of an input differential signal, respectively. The VGA 100 is configured to generate an output differential signal including positive and negative components Vout_p and Vout_n at the drains of the input NMOS M12 and M11, respectively. The gates of the current-source NMOS M13 and M14 are configured to receive a bias voltage NBIAS for setting the current I through the devices.

In operation, the input differential signal (Vin_p and Vin_n) produces current flow through the parallel capacitor CS and resistor RS. For example, if the input differential signal is such that Vin_p and Vin_n are at logic high and low voltages (e.g., Vdd and ground), the input NMOS M11 and M12 are turned on and off, respectively. This causes current I (shown as a dashed line) to flow from the source of M11 to the source of M12. Similarly, if the input differential signal is such that Vin_p and Vin_n are at logic low and high voltages, the input NMOS M11 and M12 are turned off and on, respectively. This causes current I (shown as a solid line) to flow from the source of M12 to the source of M11.

The current I generated based on the input differential signal includes a wide range of frequency components. In general, lower frequency components $I_{lf}$ of the current I flow primarily through the resistor RS and the higher frequency components $I_{hf}$ of the current I flow primarily through the capacitor CS. Because the lower frequency components $I_{lf}$ of the current I flow through the resistor RS (where IR losses occur) and the high frequency components $I_{hf}$ of the current I flow through the capacitor CS (which has lower impedance than the resistor RS for the high frequency components $I_{hf}$), the VGA 100 is characterized as having a higher gain profile (e.g., a peak) for higher frequency components and a lower gain for the lower frequency components of the input differential signal. The capacitor CS and resistor RS are made variable for configuring the gain-frequency response for the VGA 100 as desired (e.g., setting the zero and pole of the gain-frequency response).

Figure 2:
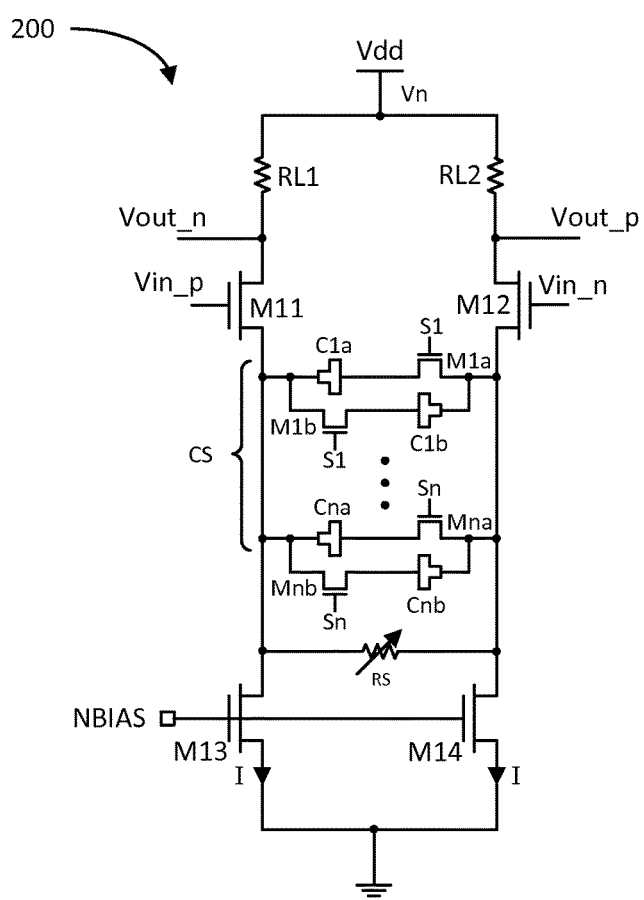
FIG. 2 illustrates a schematic diagram of another exemplary variable gain amplifier (VGA) in accordance with another aspect of the disclosure.

FIG. 2 illustrates a schematic diagram of another exemplary VGA 200 in accordance with another aspect of the disclosure. The VGA 200 may be a more detailed implementation of VGA 100, and includes many of the same elements as indicated by the same component identifiers. More specifically, the VGA 200 differs from VGA 100 in that it includes an exemplary more detailed implementation of the variable capacitor CS.

That is, the variable capacitor CS may be implemented with a discrete number "n" of selectable capacitance paths coupled between the sources of the input NMOS M11 and M12. Each of the selectable capacitance paths 1-n includes a first capacitor (a corresponding one of C1a-Cna) coupled in series with a first switch (a corresponding one of M1a-Mna), and a second capacitor (a corresponding one of C1b-Cnb) coupled in series with a second switch (a corresponding one of M1b-Mnb). The series-connected first capacitor and first switch are coupled in parallel with the series-connected second capacitor and second switch between the sources of input NMOS M11 and M12. The switches M1a-b to Mna-b may be configured as FETs with gates configured to receive control signals S1 to Sn for controlling the on/off states of the switches, respectively.

To reduce asymmetrical distortion in the output differential signal Vout_p and Vout_n, each of the selectable capacitance paths 1-n are configured substantially symmetrical. That is, the capacitors C1a-Cna and switches M1a-Mna are coupled to the sources of M11 and M12, respectively. Whereas, capacitors C1b-Cnb and switches M1b-Mnb are coupled to the sources of M12 and M11, respectively. Further, in this regards, as each capacitor may be configured as a diode-connected FET (e.g., drain and source shorted together), the gates of capacitors C1a-Cna are coupled to the source of NMOS M11 and the gates of capacitors C1b-Cnb are coupled to the source of NMOS M12. Accordingly, as such, the shorted drain-source of capacitors C1a-Cna are coupled to corresponding switches M1a-Mna, and the shorted drain-source of capacitors C1b-Cnb are coupled to corresponding switches M1b-Mnb, respectively.

There are a few drawbacks with VGAs 100 and 200. First, both VGAs 100 and 200 may be susceptible to power supply noise Vn propagating into the signal path of the VGAs. That is, the VGAs 100 and 200 do not implement an effective technique of reducing noise Vn present on the supply voltage rail Vdd from propagating into the signal path (e.g., the currents I, output differential voltage, etc.) of the VGAs.

Second, because the capacitors C1a/b-Cna/b are coupled between the sources of M11 and M12, they are not subjected to relatively high voltages across them as most of the voltage drop occurs across the load resistors RL1 and RL2. Accordingly, the capacitors C1a/b-Cna/b are biased to have low capacitance density. Accordingly, a relatively large IC area is needed to implement the capacitors C1-Cn for the needed capacitance.

Third, because the IC area to implement the capacitors C1a/b-Cna/b is relatively large, lots of wiring is required to couple the capacitors C1-Cn to the sources of the input NMOS M11 and M12. Such wiring adds parasitic reactance, which causes the gain-frequency responses of the VGAs 100 and 200 to exhibit unwanted peaks at high frequencies.

Figure 3:
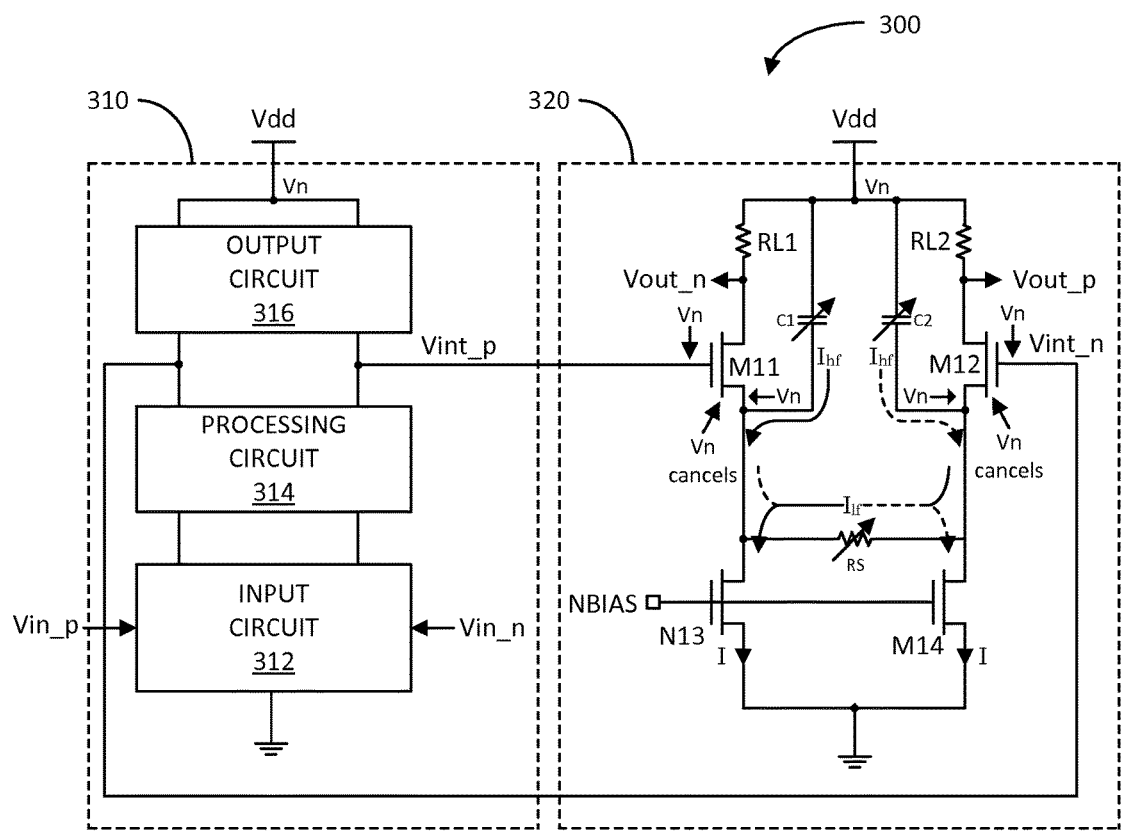
FIG. 3 illustrates a schematic diagram of an exemplary apparatus including a variable gain amplifier (VGA) in accordance with another aspect of the disclosure.

FIG. 3 illustrates a schematic diagram of an exemplary apparatus 300 including a VGA 320 in accordance with another aspect of the disclosure. The VGA 320 includes some of the same elements as in VGAs 100 and 200, as indicated by the same component identifiers. For supply noise cancellation or rejection purposes as discussed further herein, the apparatus 300 further includes a previous stage circuit 310 for generating an input differential signal Vint_p and Vint_n for the VGA 320. Additionally, for reducing IC area and wiring parasitic effects discussed in more detail herein, the VGA 320 includes variable capacitors C1 and C2 coupled between a power supply rail Vdd and the sources of input NMOS M11 and M12, respectively.

In particular, the previous stage circuit 310 may be configured into any type of circuit for generating input differential signal Vint_p and Vint_n for the VGA 320. Such type of circuit may include a fixed-gain amplifier, another VGA, an equalizer, a latch, a level shifter, and others. In general, the previous stage circuit 310 includes an input circuit 312 configured to receive an input differential signal Vin_p and Vin_n. The previous stage circuit 310 further includes a processing circuit 314 for performing a specified processing based on the input differential signal Vint_p and Vin_n. Additionally, the previous stage circuit 310 further includes an output circuit 316 for generating the differential signal Vint_p and Vint_n based on the processing performed by the processing circuit 314. The differential signal Vint_p and Vint_n serve as input differential signal for the VGA 320.

As examples, if the previous stage circuit 310 is configured as a fixed-gain amplifier, VGA, or equalizer, the input circuit 312 may include input transistors, the processing circuit 314 may include a fixed or variable resistor and/or fixed or variable capacitor coupled across terminals of the input transistors, and the output circuit 316 may include a pair of load resistors, similar to the configurations of VGAs 100, 200, and 320. If the previous stage circuit is configured as a latch or level shifter, the input circuit 312 may include input transistors, the output circuit 316 may include an output transistors, and the processing circuit 314 may include a cross-coupling of the input transistors to the output transistor.

Although, as illustrated, the output circuit 316, processing circuit 314, and input circuit 312 are shown coupled in series in that order between the first voltage rail (e.g., Vdd) and the second voltage rail (e.g., ground), it shall be understood that they need not be coupled in series in that order. For instance, in the case of a fixed amplifier, VGA, or equalizer, the processing circuit 314 may be positioned after the input circuit 312 between Vdd and ground.

The previous stage circuit 310 is configured to generate a differential signal including positive component Vint_p and negative component Vint_n, which are applied to the gates of input NMOS M11 and M12, respectively. The positive and negative components Vint_p and Vint_n generated by the previous stage circuit 310 are also based on Vdd, the same rail voltage Vdd for VGA 320. Accordingly, noise Vn from the power supply rail Vdd propagate with the positive and negative components Vint_p and Vint_n to the gates of the input NMOS M11 and M12, respectively.

Since the capacitors C1 and C2 are coupled between the power supply voltage Vdd and the sources of the input NMOS M11 and M12, the capacitors C1 and C2 couple the supply noise Vn to the sources of the input NMOS M11 and M12. Thus, the power supply noise Vn is at both the gates and sources of input NMOS M11 and M12, respectively. Because the effective input signal for the VGA 320 is the gate-to-source voltages Vgs of M11 and M12, noise cancellation of power supply noise Vn occurs across Vgs because the noise Vn is on both the gate and source of NMOS M11 and M12.

Also, in this configuration, the variable capacitors C1 and C2 are coupled to the power supply rail Vdd, and thereby, the voltages across the capacitors C1 and C2 are much higher than across the capacitor CS of VGAs 100 and 200. Accordingly, the capacitors C1 and C2 are biased to exhibit substantially higher capacitance density (e.g., approximately eight (8) times higher). Thus, the IC area to implement C1 and C2 may be substantially smaller than the IC area to implement CS.

Furthermore, because the IC area to implement C1 and C2 is relatively small, the wiring required to couple C1 and C2 to the power supply rail Vdd and the sources of NMOS M11 and M12 may be substantially less than the wiring required to couple CS to the sources of NMOS M11 and M12. As a consequence, there is substantially less parasitic reactance due to wiring, which may reduce unwanted peaking of the gain-frequency response at high frequencies.

The gain-frequency response of VGA 320 is similar to that of VGAs 100 and 200, except that the gain-frequency response of VGA 300 may be configured to have less unwanted peaking at high frequencies. Similar to VGAs 100 and 200, the VGA 320 has a lower low frequency gain since the low frequency components $I_{lf}$ of the current I flow through the resistor RS, and a higher high frequency gain since the high frequency components $I_{hf}$ flow through the capacitors C1 and C2.

Figure 4:
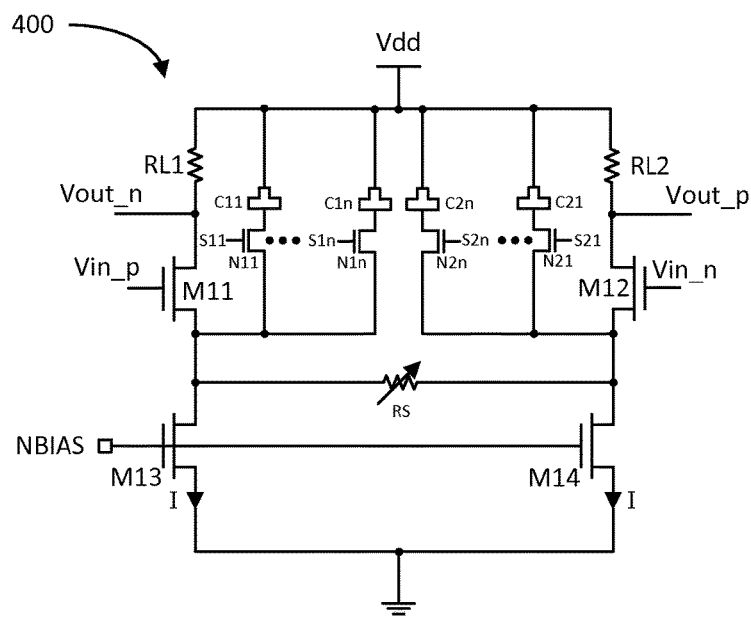
FIG. 4 illustrates a schematic diagram of another exemplary variable gain amplifier (VGA) in accordance with another aspect of the disclosure.

FIG. 4 illustrates a schematic diagram of an exemplary VGA 400 in accordance with another aspect of the disclosure. The VGA 400 may be an exemplary detailed implementation of VGA 320. In particular, the variable capacitor C1 may be implemented as a first set of "n" selectable capacitance paths coupled between the power supply rail Vdd and the source of input NMOS M11, and a second set of "n" selectable capacitance paths coupled between the power supply rail Vdd and the source of input NMOS M12. Each of then selectable capacitance paths coupled between Vdd and source of NMOS M11 includes a capacitor (a corresponding one of C11-C1n) coupled in series with a switch (a corresponding one of N11-N1n). Similarly, each of the n selectable capacitance paths coupled between Vdd and source of NMOS M12 includes a capacitor (C21-C2n) coupled in series with a switch (N21-N2n).

The capacitors C11-C1n and C21-C2n may each be configured as a FET (e.g., NMOS) with drain and source shorted together, wherein the gate is coupled to the power supply rail Vdd and the shorted drain-source is coupled to the corresponding switch. The switches N11-N1n and N21-N2n may each be configured as a FET (e.g., NMOS) including drain and source coupled between the corresponding capacitor and the corresponding source of M11 or M12. Control signals S11-S1n and S21-S2n are applied to the gates of the switches N11-N1n and N21-N2n for setting the on/off states of the switches, respectively.

Figure 5:
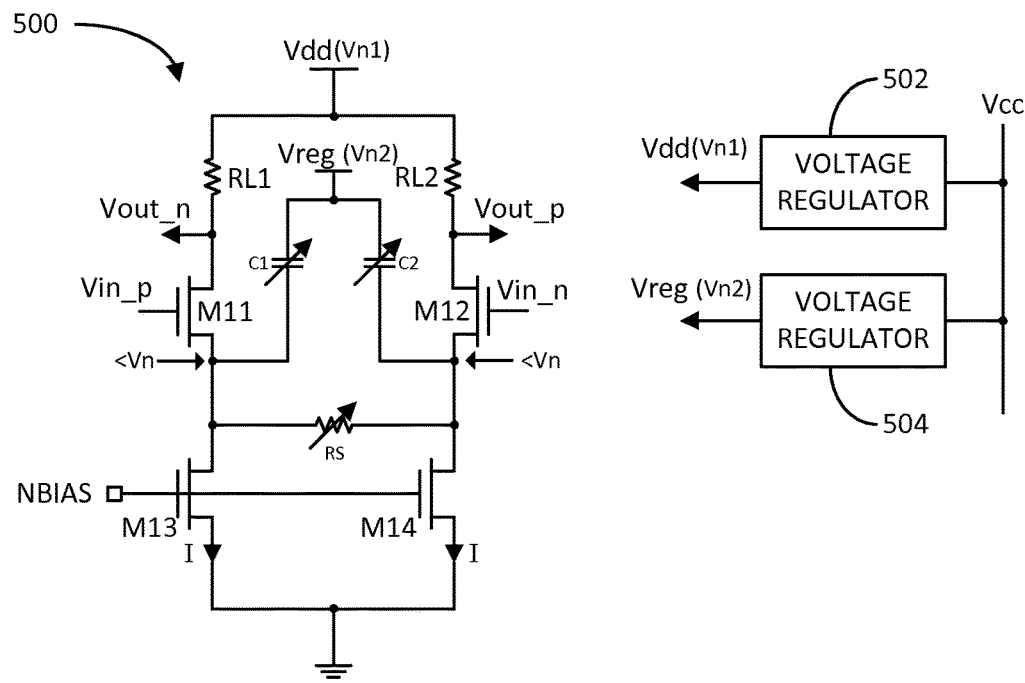
FIG. 5 illustrates a schematic diagram of another exemplary variable gain amplifier (VGA) in accordance with another aspect of the disclosure.

FIG. 5 illustrates a schematic diagram of another exemplary VGA 500 in accordance with another aspect of the disclosure. The VGA 500 is similar to VGA 320 and includes many of the same elements as indicated by the same component identifiers. The VGA differs from VGA 320 in that the variable capacitors C1 and C2 are coupled between a different voltage rail Vreg and the sources of input NMOS M11 and M12, respectively. The supply voltage at the voltage rail Vdd may be generated by a voltage regulator 502 based on another supply voltage Vcc. The supply voltage at the voltage rail Vreg may be generated by a different regulator 504 also based on the voltage rail Vcc.

The voltage regulator 504 may be configured to generate a better regulated and cleaner supply voltage Vreg with noise Vn2 (e.g., root mean square (RMS) noise) being less than noise Vn1 (e.g., RMS noise) present on power supply voltage Vdd. This implementation may be useful if the output of the previous stage is not based on Vdd; in which case, noise cancellation may not occur across Vgs of the input NMOS M11 and M12, as did in VGA 320. The variable capacitors C1 and C2 may be implemented using selectable capacitive paths as in VGA 400.

Figure 6:
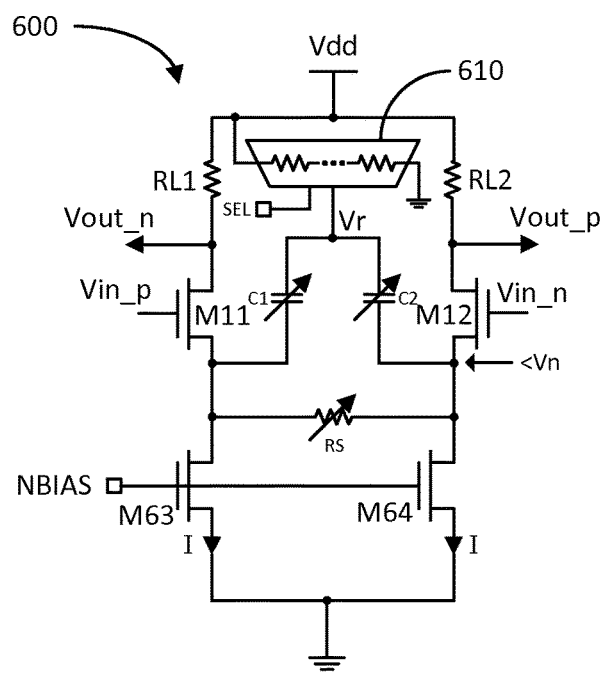
FIG. 6 illustrates a schematic diagram of another exemplary variable gain amplifier (VGA) in accordance with another aspect of the disclosure.

FIG. 6 illustrates a schematic diagram of another exemplary VGA 600 in accordance with another aspect of the disclosure. The VGA 600 is similar to VGA 320 and includes many of the same elements as indicated by the same component identifiers. VGA 600 differs from VGA 320 in that VGA 600 includes a selectable voltage divider 610 coupled between the power supply rail Vdd and ground. Based on a select signal (SEL), the voltage divider 610 applies a selected bias voltage Vr to the capacitors C1 and C2. The bias voltage Vr may be selected to bias the capacitors C1 and C2 so that they each exhibit a particular capacitance density. Or, in other words, the bias voltage Vr may be selected to vary or set the capacitance of C1 and C2. In such case, C1 and C2 may be implemented as fixed capacitance paths (without selectable switches), or may be implemented as selectable capacitance paths as in VGA 400.

Although in VGA 600, the voltage divider 610 is coupled between the first voltage rail (e.g., Vdd) and the second voltage rail (e.g., ground), it shall be understood that the voltage divider may be coupled between a different voltage rail (e.g., Vreg) as in VGA 500 and ground. In such configuration, the selected bias voltage Vr is based on the better regulated (less-noisy) supply voltage Vr instead of Vdd.

Figure 7:
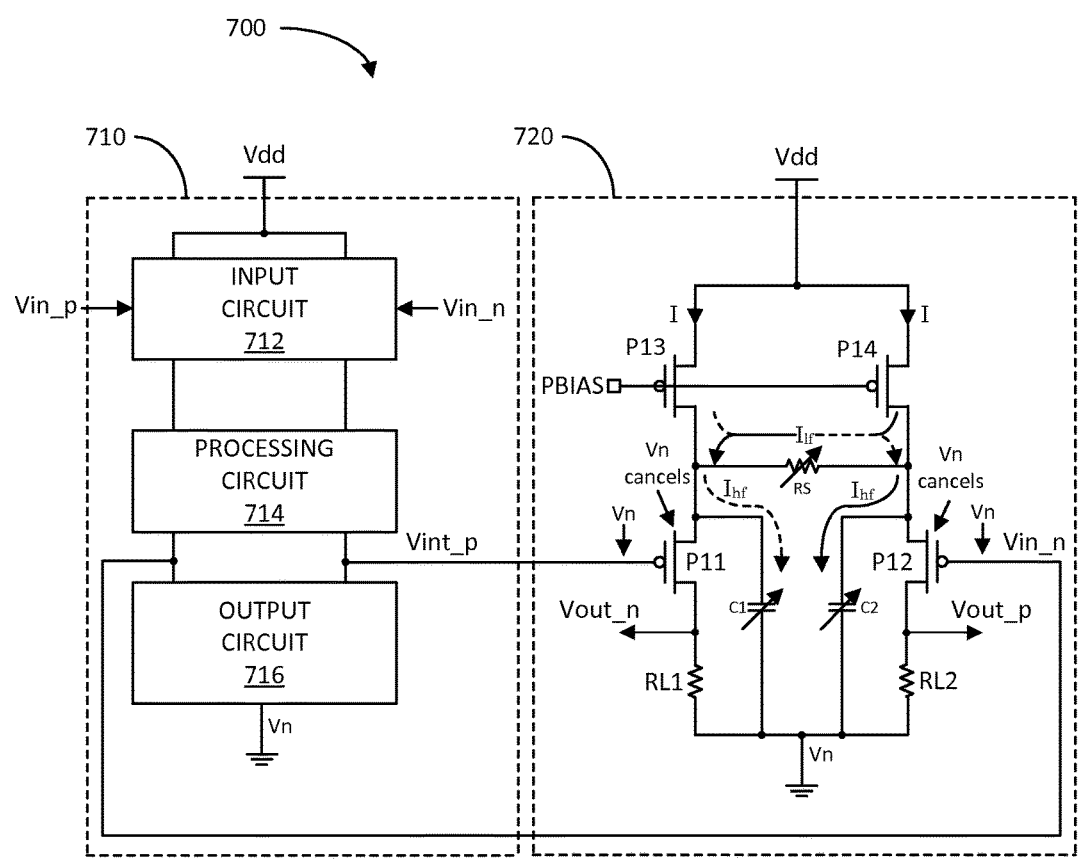
FIG. 7 illustrates a schematic diagram of another exemplary apparatus including a variable gain amplifier (VGA) in accordance with another aspect of the disclosure.

FIG. 7 illustrates a schematic diagram of an exemplary apparatus 700 including a VGA 720 in accordance with another aspect of the disclosure. The apparatus 700 is similar to that of apparatus 300, but includes a p-version of the VGA 320. That is, VGA 720 is implemented with p-channel metal oxide semiconductor (PMOS) FETs (referred to hereinafter as "PMOS"), instead of NMOS devices as in VGA 320.

In particular, the VGA 720 includes a first current-source PMOS P13, a first input PMOS P11, and a first load resistor RL1 coupled in series between a first voltage rail (e.g., Vdd) and a second voltage rail (e.g., ground). Additionally, the VGA 720 includes a second current-source PMOS P14, a second input PMOS P12, and a second load resistor RL2 coupled in series between Vdd and ground. The gates of the first and second current-source PMOS P13 and P14 are coupled together, and configured to receive a bias voltage PBIAS to set the current I through the devices. The gates of the input PMOS P11 and P12 are configured to receive positive and negative components Vint_p and Vint_n of a differential signal generated by a previous stage circuit 710.

The VGA 720 further includes a variable resistor RS coupled between the sources of the input PMOS P11 and P12. It shall be understood that the resistor RS may be configured as a fixed resistor. Additionally, the VGA 720 includes variable capacitors C1 and C2 coupled between the sources of the input PMOS P11 and P12 and ground, respectively. It shall be understood that one or both of the capacitors C1 and C2 may be configured as fixed capacitors. The resistance of the resistor RS and capacitance of the capacitors C1 and C2 may be varied or selected to achieve a desired gain-frequency response for the VGA 720.

Similar to previous stage circuit 310, the previous stage circuit 710 of apparatus 700 may be configured into any type of circuit for generating input differential signal Vint_p and Vint_n for the VGA 720. Such type of circuit may include a fixed-gain amplifier, a VGA, an equalizer, a latch, a level shifter, and others. In general, the previous stage circuit 710 includes an input circuit 712 configured to receive an input differential signal Vin_p and Vin_n. The previous stage circuit 710 further includes a processing circuit 714 for performing a specified processing based on the input differential signal Vint_p and Vin_n. Additionally, the previous stage circuit 710 further includes an output circuit 716 for generating the differential signal Vint_p and Vint_n based on the processing performed by the processing circuit 714. As discussed, the differential signal Vint_p and Vint_n serve as an input differential signal for the VGA 720.

As examples, if the previous stage circuit 710 is configured as a fixed-gain amplifier, VGA, or equalizer, the input circuit 712 may include input transistors, the processing circuit 714 may include a fixed or variable resistor and/or fixed or variable capacitor coupled to terminals of the input transistors, and the output circuit 716 may include a pair of load resistors. If the previous stage circuit 710 is configured as a latch or level shifter, the input circuit 712 may include input transistors, the output circuit 716 may include output transistors, and the processing circuit 714 may include a cross-coupling of the input transistors to the output transistors.

Although, as illustrated, the input circuit 712, processing circuit 714, and output circuit 716 are shown coupled in series in that order between the first voltage rail (e.g., Vdd) and the second voltage rail (e.g., ground), it shall be understood that they need not be coupled in series in that order. For instance, in the case of a fixed amplifier, VGA, or equalizer, the processing circuit 714 may be positioned above the input circuit 712 between Vdd and ground.

The previous stage circuit 710 is configured to generate a differential signal including positive component Vint_p and negative component Vint_n, which are applied to the gates of input PMOS P11 and P12, respectively. The positive and negative components Vint_p and Vint_n generated by the previous stage circuit 710 are also based on the potential of the second voltage rail (e.g., ground), the same second voltage rail (e.g., ground) of VGA 720. Accordingly, noise Vn (e.g., ground bounce) from the second supply rail (e.g., ground) propagate with the positive and negative components Vint_p and Vint_n to the gates of the input PMOS P11 and P12, respectively.

Since the capacitors C1 and C2 are coupled between the sources of the input PMOS P11 and P12 and ground, the capacitors C1 and C2 couple the ground noise Vn to the sources of the input PMOS P11 and P12. Thus, the ground noise Vn is at both the gates and sources of input PMOS P11 and P12, respectively. Because the effective input signal for the VGA 720 is the gate-to-source voltages Vgs of PMOS P11 and P12, ground noise cancellation occurs across Vgs because the noise Vn is on both the gate and source of PMOS P11 and P12.

Also, in this configuration, the voltage across the variable capacitors C1 and C2 is much higher than the voltage across the capacitor CS of VGAs 100 and 200. This is because there is a significant voltage drop across the load resistors RL1 and RL2 due to the current I. This causes the voltages at the sources of input PMOS P11 and P12 to be relatively high. As the other ends of the variable capacitors C1 and C2 are coupled to ground, the capacitors C1 and C2 are biased with a relatively high voltage. Accordingly, the capacitors C1 and C2 are biased to exhibit substantially higher capacitance density (e.g., approximately eight (8) times higher). Thus, the IC area to implement C1 and C2 may be substantially smaller than the IC area to implement CS.

Furthermore, because the IC area to implement C1 and C2 is relatively small, the wiring required to couple C1 and C2 to ground and the sources of PMOS P11 and P12 may be substantially less than the wiring required to couple CS to the sources of NMOS M11 and M12. As a consequence, there may be substantially less parasitic reactance due to wiring, which may reduce unwanted peaking of the gain-frequency response at high frequencies.

The gain-frequency response of VGA 720 is similar to that of VGA 320. That is, similar to VGA 320, the VGA 720 has a lower low frequency gain since the low frequency components $I_{lf}$ of the current I flow through the resistor RS, and a higher high frequency gain since the high frequency components $I_{hf}$ flow through the capacitors C1 and C2. By adjusting the resistance of resistor RS and capacitance of capacitors C1 and C2, a desired gain-frequency response for the VGA 720 may be achieved.

Figure 8:
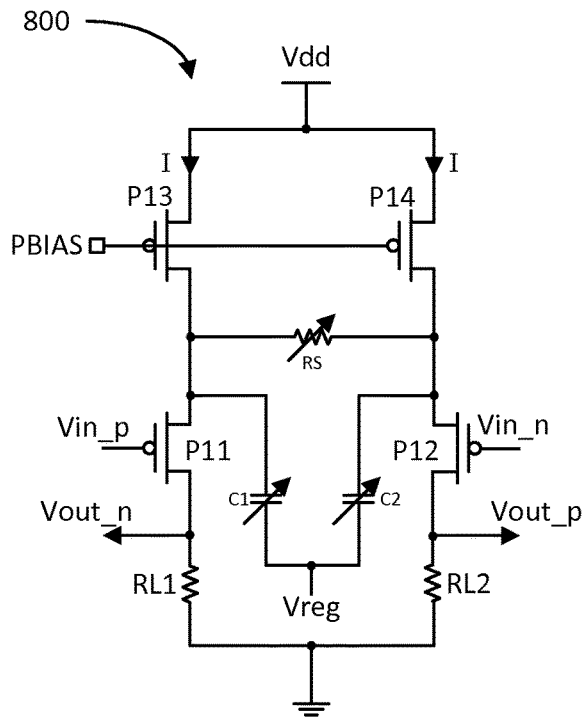
FIG. 8 illustrates a schematic diagram of another exemplary variable gain amplifier (VGA) in accordance with another aspect of the disclosure.

FIG. 8 illustrates a schematic diagram of another exemplary VGA 800 in accordance with another aspect of the disclosure. The VGA 800 is similar to VGA 720 and includes many of the same elements as indicated by the same component identifiers. VGA 800 differs from VGA 720 in that the variable capacitors C1 and C2 are coupled between a different voltage rail Vreg and the sources of input PMOS P11 and P12, respectively. Similar to VGA 500, the voltage rail Vreg may be a better regulated and cleaner supply voltage than the second rail potential (e.g., ground). Accordingly, Vreg may include noise (e.g., RMS noise) that is substantially less than noise Vn (e.g., RMS noise) present on the second voltage rail (e.g., ground). This implementation may be useful if the output of the previous stage is not based on ground; in which case, noise cancellation may not occur across Vgs of the input PMOS P11 and P12. The variable capacitors C1 and C2 may be implemented using selectable capacitive paths as discussed in detail with respect to previous embodiments.

Figure 9:
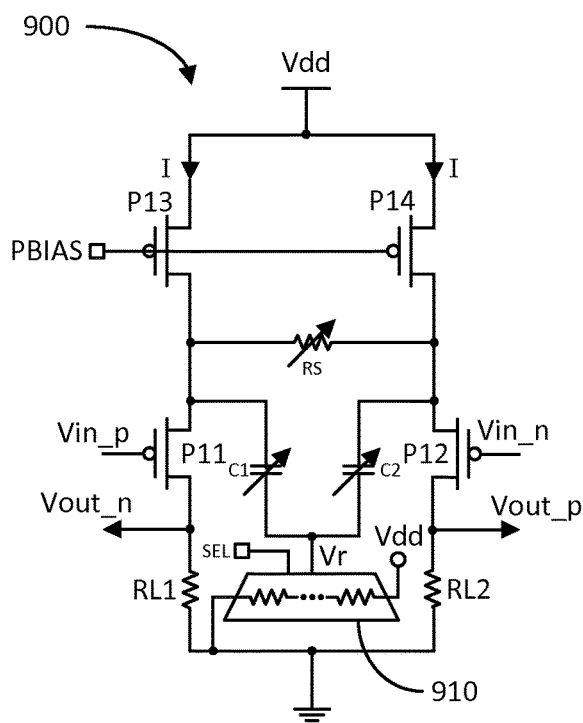
FIG. 9 illustrates a schematic diagram of another exemplary variable gain amplifier (VGA) in accordance with another aspect of the disclosure.

FIG. 9 illustrates a schematic diagram of another exemplary VGA 900 in accordance with another aspect of the disclosure. The VGA 900 is similar to VGA 720 and includes many of the same elements as indicated by the same component identifiers. VGA 900 differs from VGA 720 in that VGA 900 includes a selectable voltage divider 910 coupled between the first voltage rail Vdd and ground. Based on a select signal (SEL), the voltage divider 910 applies a selected bias voltage Vr to the capacitors C1 and C2. The bias voltage Vr may be selected to bias the capacitors C1 and C2 so that they exhibit a particular capacitance density. Or, in other words, the selected bias voltage Vr may be selected to vary or set the capacitance of C1 and C2. In such case, C1 and C2 may be implemented as fixed capacitance paths (without selectable switches), or may be implemented as selectable capacitance paths similar to VGA 400.

Although in VGA 900, the voltage divider 910 is coupled between the first voltage rail (e.g., Vdd) and the second voltage rail (e.g., ground), it shall be understood that the voltage divider 910 may be coupled between a different voltage rail (e.g., Vreg) as in VGA 800 and ground. In such configuration, the selected bias voltage Vr may be based on a better regulated (less-noisy) supply voltage Vr instead of Vdd.

Figure 10:
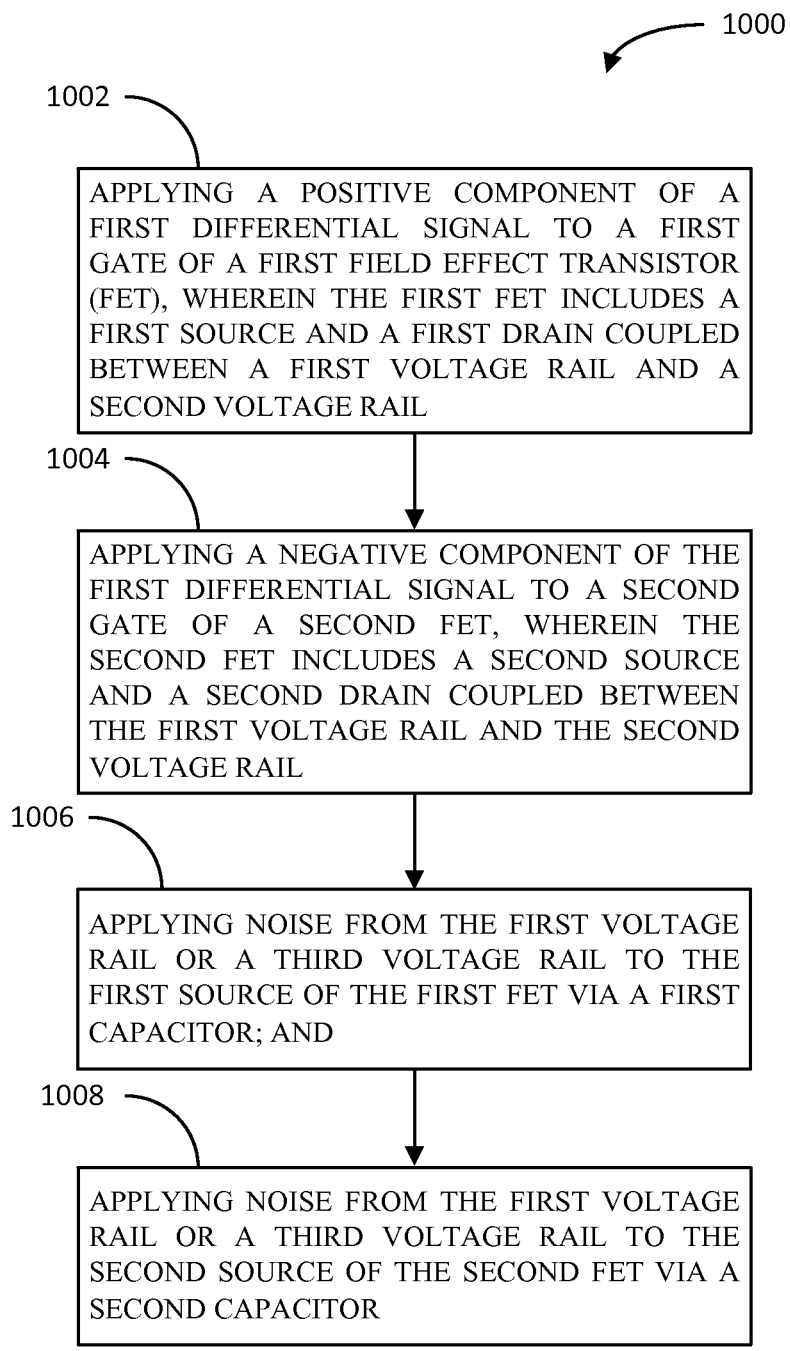
FIG. 10 illustrates a flow diagram of an exemplary method of amplifying a signal in accordance with another aspect of the disclosure.

FIG. 10 illustrates a flow diagram of an exemplary method 1000 of amplifying a signal in accordance with another aspect of the disclosure. The method 1000 includes applying a positive component of a first differential signal to a first gate of a first field effect transistor (FET), wherein the first FET includes a first source and a first drain coupled between a first voltage rail and a second voltage rail (block 1002). As an example, the previous stage circuits 310 and 710 are examples of means for applying the positive component of the first differential signal to the first gate of the first FET.

The method 1000 further includes applying a negative component of the first differential signal to a second gate of a second FET, wherein the second FET includes a second source and a second drain coupled between the first voltage rail and the second voltage rail (block 1004). Similarly, the previous stage circuits 310 and 710 are examples of means for applying the negative component of the first differential signal to the second gate of the second FET.

The method 1000 further includes applying noise from the first voltage rail or a third voltage rail to the first source of the first FET via a first capacitor (block 1006). For example, the capacitor C1 is an example of a means for applying noise from the first voltage rail or the third voltage rail to the first source of the first FET.

Additionally, the method 1000 includes applying noise from the first voltage rail or the third voltage rail to the second source of the second FET (block 1008). For example, the capacitor C2 is an example of means for applying noise from the first voltage rail or the third voltage rail to the second source of the second FET.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a first field effect transistor (FET) including a first gate, a first source, and a first drain, wherein the first gate is configured to receive a positive component of a first differential signal, and wherein the first source and the first drain are coupled between a first voltage rail and a second voltage rail;
a second FET including a second gate, a second source, and a second drain, wherein the second gate is configured to receive a negative component of the first differential signal, and wherein the second source and the second drain are coupled between the first voltage rail and the second voltage rail, wherein the positive component and the negative component of the first differential signal are based on a supply voltage at the first voltage rail;
a first capacitor directly coupled between the first voltage rail or a third voltage rail and the first source of the first FET; and
a second capacitor directly coupled between the first voltage rail or the third voltage rail and the second source of the second FET.

2. The apparatus of claim 1, further comprising a previous stage circuit configured to generate the positive and negative components of the first differential signal based on an input signal.

3. The apparatus of claim 1, wherein the first and second capacitors are coupled to the third voltage rail, wherein a first supply voltage at the first voltage rail includes more supply noise than a second supply voltage at the third voltage rail.

4. An apparatus, comprising:
a first field effect transistor (FET) including a first gate, a first source, and a first drain, wherein the first gate is configured to receive a positive component of a first differential signal, and wherein the first source and the first drain are coupled between a first voltage rail and a second voltage rail;
a second FET including a second gate, a second source, and a second drain, wherein the second gate is configured to receive a negative component of the first differential signal, and wherein the second source and the second drain are coupled between the first voltage rail and the second voltage rail;
a first capacitor coupled between the first voltage rail or a third voltage rail and the first source of the first FET;
a second capacitor coupled between the first voltage rail or the third voltage rail and the second source of the second FET; and
a voltage divider coupled between the first voltage rail or the third voltage rail and the second voltage rail, wherein the voltage divider is configured to generate a selected bias voltage, wherein the first and second capacitors comprise first and second capacitances based on the selected bias voltage, respectively.

5. The apparatus of claim 1, wherein the first and second capacitors comprise first and second variable capacitors, respectively.

6. An apparatus, comprising:
a first field effect transistor (FET) including a first gate, a first source, and a first drain, wherein the first gate is configured to receive a positive component of a first differential signal, and wherein the first source and the first drain are coupled between a first voltage rail and a second voltage rail;
a second FET including a second gate, a second source, and a second drain, wherein the second gate is configured to receive a negative component of the first differential signal, and wherein the second source and the second drain are coupled between the first voltage rail and the second voltage rail;
a first capacitor coupled between the first voltage rail or a third voltage rail and the first source of the first FET, wherein the first capacitor comprises a first set of capacitance paths each configured to be selectively coupled between the first voltage rail or the third voltage rail and the first source of the first FET;
a second capacitor coupled between the first voltage rail or the third voltage rail and the second source of the second FET, wherein the second capacitor comprises a second set of capacitance paths each configured to be selectively coupled between the first voltage rail or the third voltage rail and the second source of the second FET.

7. An apparatus, comprising:
a first field effect transistor (FET) including a first gate, a first source, and a first drain, wherein the first gate is configured to receive a positive component of a first differential signal, and wherein the first source and the first drain are coupled between a first voltage rail and a second voltage rail;
a second FET including a second gate, a second source, and a second drain, wherein the second gate is configured to receive a negative component of the first differential signal, and wherein the second source and the second drain are coupled between the first voltage rail and the second voltage rail;
a first capacitor coupled between the first voltage rail or a third voltage rail and the first source of the first FET;
a second capacitor coupled between the first voltage rail or the third voltage rail and the second source of the second FET; and
a resistor coupled between the first source of the first FET and the second source of the second FET.

8. An apparatus, comprising:
a first field effect transistor (FET) including a first gate, a first source, and a first drain, wherein the first gate is configured to receive a positive component of a first differential signal, and wherein the first source and the first drain are coupled between a first voltage rail and a second voltage rail;
a second FET including a second gate, a second source, and a second drain, wherein the second gate is configured to receive a negative component of the first differential signal, and wherein the second source and the second drain are coupled between the first voltage rail and the second voltage rail;
a first capacitor coupled between the first voltage rail or a third voltage rail and the first source of the first FET;
a second capacitor coupled between the first voltage rail or the third voltage rail and the second source of the second FET;
a first resistor coupled between the first voltage rail and the first drain of the first FET;
a second resistor coupled between the first voltage rail and the second drain of the second FET;
wherein a negative component of a second differential signal is generated at a first node between the first resistor and the first drain of the first FET; and
wherein a positive component of the second differential signal is generated at a second node between the second resistor and the second drain of the second FET.

9. The apparatus of claim 1, further comprising:
a third FET including a third gate, a third source, and a third drain, wherein the third gate is configured to receive a bias voltage configured to set a first current through the third FET, and wherein the third source and the third drain are coupled in series with the first source and the first drain of the first FET between the first voltage rail and the second voltage rail; and
a fourth FET including a fourth gate, a fourth source, and a fourth drain, wherein the fourth gate is configured to receive the bias voltage configured to set a second current through the fourth FET, and wherein the fourth source and the fourth drain are coupled in series with the second source and the second drain of the second FET between the first voltage rail and the second voltage rail.

10. A method, comprising:
applying a positive component of a first differential signal to a first gate of a first field effect transistor (FET), wherein the first FET includes a first source and a first drain coupled between a first voltage rail and a second voltage rail;
applying a negative component of the first differential signal to a second gate of a second FET, wherein the second FET includes a second source and a second drain coupled between the first voltage rail and the second voltage rail;
applying noise directly from the first voltage rail or a third voltage rail to the first source of the first FET via a first capacitor;

applying noise directly from the first voltage rail or the third voltage rail to the second source of the second FET via a second capacitor;

applying noise from the first voltage rail to the first gate of the first FET; and applying noise from the first voltage rail to the second gate of the second FET.

11. The method of claim 10, wherein applying noise from the first voltage rail to the first gate of the first FET comprises applying the noise via a first portion of a previous stage circuit configured to generate the positive component of the first differential signal, and wherein applying noise from the first voltage rail to the second gate of the second FET comprises applying the noise via a second portion of the previous stage circuit configured to generate the negative component of the first differential signal.

12. The method of claim 10, further comprising:
generating a first supply voltage at the first voltage rail; and
generating a second supply voltage at the third voltage rail, wherein noise associated with generating the first supply voltage is more than noise associated with generating the second supply voltage.

13. A method, comprising:
applying a positive component of a first differential signal to a first gate of a first field effect transistor (FET), wherein the first FET includes a first source and a first drain coupled between a first voltage rail and a second voltage rail;
applying a negative component of the first differential signal to a second gate of a second FET, wherein the second FET includes a second source and a second drain coupled between the first voltage rail and the second voltage rail;
applying noise from the first voltage rail or a third voltage rail to the first source of the first FET via a first capacitor;
applying noise from the first voltage rail or the third voltage rail to the second source of the second FET via a second capacitor;
generating a selected bias voltage based on a first supply voltage at the first voltage rail or a second supply voltage at the third voltage rail; and
applying the selected bias voltage to the first and second capacitors, wherein first and second capacitances of the first and second capacitors are based on the selected bias voltage, respectively.

14. The method of claim 10, further comprising varying a capacitance of one or more of the first capacitor or the second capacitor.

15. A method, comprising:
applying a positive component of a first differential signal to a first gate of a first field effect transistor (FET), wherein the first FET includes a first source and a first drain coupled between a first voltage rail and a second voltage rail;
applying a negative component of the first differential signal to a second gate of a second FET, wherein the second FET includes a second source and a second drain coupled between the first voltage rail and the second voltage rail;
applying noise from the first voltage rail or a third voltage rail to the first source of the first FET via a first capacitor;
applying noise from the first voltage rail or the third voltage rail to the second source of the second FET via a second capacitor;

varying a first capacitance of the first capacitor by selectively coupling one or more of a first set of capacitance paths between the first voltage rail or the third voltage rail and the first source of the first FET; and varying a second capacitance of the second capacitor by selectively coupling one or more of a second set of capacitance paths between the first voltage rail or the third voltage rail and the second source of the second FET.

16. A method, comprising:
applying a positive component of a first differential signal to a first gate of a first field effect transistor (FET), wherein the first FET includes a first source and a first drain coupled between a first voltage rail and a second voltage rail;
applying a negative component of the first differential signal to a second gate of a second FET, wherein the second FET includes a second source and a second drain coupled between the first voltage rail and the second voltage rail;
applying noise from the first voltage rail or a third voltage rail to the first source of the first FET via a first capacitor;
applying noise from the first voltage rail or the third voltage rail to the second source of the second FET via a second capacitor; and
directing current through a resistor coupled between the first source of the first FET and the second source of the second FET, wherein the current is based on the positive and negative components of the first differential signal.

17. A method, comprising:
applying a positive component of a first differential signal to a first gate of a first field effect transistor (FET), wherein the first FET includes a first source and a first drain coupled between a first voltage rail and a second voltage rail;
applying a negative component of the first differential signal to a second gate of a second FET, wherein the second FET includes a second source and a second drain coupled between the first voltage rail and the second voltage rail;
applying noise from the first voltage rail or a third voltage rail to the first source of the first FET via a first capacitor;
applying noise from the first voltage rail or the third voltage rail to the second source of the second FET via a second capacitor;
directing a first current through a first resistor coupled between the first voltage rail and the first drain of the first FET based on the positive component of the first differential signal;
directing a second current through a second resistor coupled between the first voltage rail and the second drain of the second FET based on the negative component of the first differential signal;
generating a negative component of a second differential signal at a first node between the first resistor and the first drain of the first FET based on the first current; and
generating a positive component of the second differential signal at a second node between the second resistor and the second drain of the second FET based on the second current.

18. The method of claim 10, further comprising:
setting a first current through a third FET including applying a bias voltage to a third gate of the third FET, wherein the third FET comprises a third source and a third drain coupled in series with the first source and the first drain of the first FET between the first voltage rail and the second voltage rail; and setting a second current through a fourth FET including applying the bias voltage to a fourth gate of the fourth FET, wherein the fourth FET comprises a fourth source and a fourth drain coupled in series with the second source and the second drain of the second FET between the first voltage rail and the second voltage rail.

19. An apparatus, comprising:
means for applying a positive component of a first differential signal to a first gate of a first field effect transistor (FET), wherein the first FET includes a first source and a first drain coupled between a first voltage rail and a second voltage rail;
means for applying a negative component of the first differential signal to a second gate of a second FET, wherein the second FET includes a second source and a second drain coupled between the first voltage rail and the second voltage rail;
means for applying noise directly from the first voltage rail or a third voltage rail to the first source of the first FET via a first capacitor;
means for applying noise directly from the first voltage rail or the third voltage rail to the second source of the second FET via a second capacitor;
means for applying noise from the first voltage rail to the first gate of the first FET; and
means for applying noise from the first voltage rail to the second gate of the second FET.

20. The apparatus of claim 19, wherein the means for applying noise from the first voltage rail to the first gate of the first FET comprises means for applying the noise via a first portion of a previous stage circuit configured to generate the positive component of the first differential signal, and wherein the means for applying noise from the first voltage rail to the second gate of the second FET comprises means for applying the noise via a second portion of the previous stage circuit configured to generate the negative component of the first differential signal.

21. The apparatus of claim 19, further comprising:
means for generating a first supply voltage at the first voltage rail; and
means for generating a second supply voltage at the third voltage rail, wherein noise associated with generating the first supply voltage is more than noise associated with generating the second supply voltage.

22. An apparatus, comprising:
means for applying a positive component of a first differential signal to a first gate of a first field effect transistor (FET), wherein the first FET includes a first source and a first drain coupled between a first voltage rail and a second voltage rail;
means for applying a negative component of the first differential signal to a second gate of a second FET, wherein the second FET includes a second source and a second drain coupled between the first voltage rail and the second voltage rail;
means for applying noise from the first voltage rail or a third voltage rail to the first source of the first FET via a first capacitor;
means for applying noise from the first voltage rail or the third voltage rail to the second source of the second FET via a second capacitor;
means for generating a selected bias voltage based on a first supply voltage at the first voltage rail or a second supply voltage at the third voltage rail; and means for applying the selected bias voltage to the first and second capacitors, wherein first and second capacitances of the first and second capacitors are based on the selected bias voltage, respectively.

23. The apparatus of claim 19, further comprising means for varying a capacitance of one or more of the first capacitor or the second capacitor.

24. An apparatus, comprising:
means for applying a positive component of a first differential signal to a first gate of a first field effect transistor (FET), wherein the first FET includes a first source and a first drain coupled between a first voltage rail and a second voltage rail;
means for applying a negative component of the first differential signal to a second gate of a second FET, wherein the second FET includes a second source and a second drain coupled between the first voltage rail and the second voltage rail;
means for applying noise from the first voltage rail or a third voltage rail to the first source of the first FET via a first capacitor;
means for applying noise from the first voltage rail or the third voltage rail to the second source of the second FET via a second capacitor;
means for varying a first capacitance of the first capacitor comprising means for selectively coupling one or more of a first set of capacitance paths between the first voltage rail or the third voltage rail and the first source of the first FET; and
means for varying a second capacitance of the second capacitor comprising means for selectively coupling one or more of a second set of capacitance paths between the first voltage rail or the third voltage rail and the second source of the second FET.

25. An apparatus, comprising:
means for applying a positive component of a first differential signal to a first gate of a first field effect transistor (FET), wherein the first FET includes a first source and a first drain coupled between a first voltage rail and a second voltage rail;
means for applying a negative component of the first differential signal to a second gate of a second FET, wherein the second FET includes a second source and a second drain coupled between the first voltage rail and the second voltage rail;
means for applying noise from the first voltage rail or a third voltage rail to the first source of the first FET via a first capacitor;
means for applying noise from the first voltage rail or the third voltage rail to the second source of the second FET via a second capacitor; and
means for directing current through a resistor coupled between the first source of the first FET and the second source of the second FET, wherein the current is based on the positive and negative components of the first differential signal.

26. An apparatus, comprising:
means for applying a positive component of a first differential signal to a first gate of a first field effect transistor (FET), wherein the first FET includes a first source and a first drain coupled between a first voltage rail and a second voltage rail;
means for applying a negative component of the first differential signal to a second gate of a second FET, wherein the second FET includes a second source and a second drain coupled between the first voltage rail and the second voltage rail;

means for applying noise from the first voltage rail or a third voltage rail to the first source of the first FET via a first capacitor;

means for applying noise from the first voltage rail or the third voltage rail to the second source of the second FET via a second capacitor;

means for directing a first current through a first resistor coupled between the first voltage rail and the first drain of the first FET based on the positive component of the first differential signal;

means for directing a second current through a second resistor coupled between the first voltage rail and the second drain of the second FET based on the negative component of the first differential signal;

means for generating a negative component of a second differential signal at a first node between the first resistor and the first drain of the first FET based on the first current; and means for generating a positive component of the second differential signal at a second node between the second resistor and the second drain of the second FET based on the second current.

27. The apparatus of claim 19, further comprising:

means for setting a first current through a third FET including means for applying a bias voltage to a third gate of the third FET, wherein the third FET comprises a third source and a third drain coupled in series with the first source and the first drain of the first FET between the first voltage rail and the second voltage rail; and means for setting a second current through a fourth FET including means for applying the bias voltage to a fourth gate of the fourth FET, wherein the fourth FET comprises a fourth source and a fourth drain coupled in series with the second source and the second drain of the second FET between the first voltage rail and the second voltage rail.

* * * * *